United States Patent
Kim et al.

(10) Patent No.: US 11,669,773 B2
(45) Date of Patent: Jun. 6, 2023

(54) ELECTRONIC DEVICES GENERATING VERIFICATION VECTOR FOR VERIFYING SEMICONDUCTOR CIRCUIT AND METHODS OF OPERATING THE SAME

(71) Applicant: Samsung Electronics Co., Ltd., Suwon-si (KR)

(72) Inventors: Seungju Kim, Suwon-si (KR); Hyojin Choi, Seoul (KR); In Huh, Seoul (KR); Jeonghoon Ko, Hwaseong-si (KR); Changwook Jeong, Busan (KR); Younsik Park, Hwaseong-si (KR); Joonwan Chai, Seoul (KR)

(73) Assignee: Samsung Electronics Co., Ltd.

( * ) Notice: Subject to any disclaimer, the term of this patent is extended or adjusted under 35 U.S.C. 154(b) by 424 days.

(21) Appl. No.: 16/915,786

(22) Filed: Jun. 29, 2020

(65) Prior Publication Data

US 2021/0117193 A1  Apr. 22, 2021

(30) Foreign Application Priority Data

Oct. 21, 2019 (KR) .................. 10-2019-0130822

(51) Int. Cl.
*G06N 20/00* (2019.01)
*G06F 9/30* (2018.01)
(Continued)

(52) U.S. Cl.
CPC ......... *G06N 20/00* (2019.01); *G06F 9/30036* (2013.01); *G06F 9/3879* (2013.01); *G06F 18/214* (2023.01); *G06F 30/3308* (2020.01)

(58) Field of Classification Search
CPC .............. G06F 9/30036; G06F 9/3879; G06F 30/3308; G06F 18/214; G06F 18/24133;
(Continued)

(56) References Cited

U.S. PATENT DOCUMENTS 5,883,906 A  3/1999 Turnquist et al.
6,327,687 B1  12/2001 Rajski et al.
(Continued)

FOREIGN PATENT DOCUMENTS

JP  2901442  6/1999
JP  2004355130  12/2004
(Continued)

OTHER PUBLICATIONS

Bean, James C. "Genetic Algorithms and Random Keys for Sequencing and Optimization" ORSA Journal on Computing 6(2):154-160 (1994).
(Continued)

*Primary Examiner* — Jack Chiang
*Assistant Examiner* — Aric Lin
(74) *Attorney, Agent, or Firm* — Myers Bigel, P.A.

(57) ABSTRACT

An electronic device configured to generate a verification vector for verifying a semiconductor circuit including a first circuit block and a second circuit block includes a duplicate command eliminator configured to receive a first input vector including a plurality of commands and to provide a first converted vector, in which ones of the plurality of commands that generate the same state transition are changed into idle commands, based on a state transition of the first circuit block obtained by performing a simulation operation on the first input vector, a reduced vector generator configured to provide a first reduced vector in which a number of repetitions of the idle commands included in the first converted vector is reduced, and a verification vector generator configured to output the first reduced vector having a coverage that coincides with a target coverage among a plurality of first reduced vectors as a first verification vector.

20 Claims, 16 Drawing Sheets

(51) Int. Cl.
  *G06F 9/38* (2018.01)
  *G06F 30/3308* (2020.01)
  *G06F 18/214* (2023.01)
(58) Field of Classification Search
  CPC .. G06K 9/6256; G06K 9/6271; G06N 3/0454;
        G06N 3/088; G06N 7/005; G06N 20/00;
                    G06N 7/01; G06N 3/045
  See application file for complete search history.

(56) References Cited

U.S. PATENT DOCUMENTS

| | | |
|---|---|---|
| 6,678,645 B1 | 1/2004 | Rajsuman et al. |
| 6,865,723 B2 | 3/2005 | Lackey |
| 6,941,497 B2 | 9/2005 | Wu et al. |
| 8,365,133 B2 | 1/2013 | Chikada |
| 8,510,105 B2 | 8/2013 | Nurminen |
| 2002/0093356 A1 | 7/2002 | Williams et al. |

FOREIGN PATENT DOCUMENTS

| | | |
|---|---|---|
| JP | 2007026362 | 2/2007 |
| KR | 100558251 | 2/2006 |
| KR | 10-0810140 | 2/2008 |

OTHER PUBLICATIONS

Kirkpatrick et al. "Optimization by Simulated Annealing" Science 220(4598):671-680 (May 13, 1983).
Snoek et al. "Practical Bayesian Optimization of Machine Learning Algorithms" NIPS'12: Proceedings of the 25th International Conference on Neural Information Processing Systems 2:2951-2959 (2012).

FIG. 4B

| IN1 | IN2 | IN3 | Q1 | Q2 |
|-----|-----|-----|----|----|
| 0 | 0 | 0 | 0 | 0 |
| 0 | 0 | 0 | 0 | 1 |
| 0 | 0 | 0 | 1 | 0 |
| 0 | 0 | 0 | 1 | 1 |
| ... | | | | |
| 1 | 1 | 1 | 1 | 1 |

ST_TB $2^3 \times 2^2$

FIG. 4C
Case 1
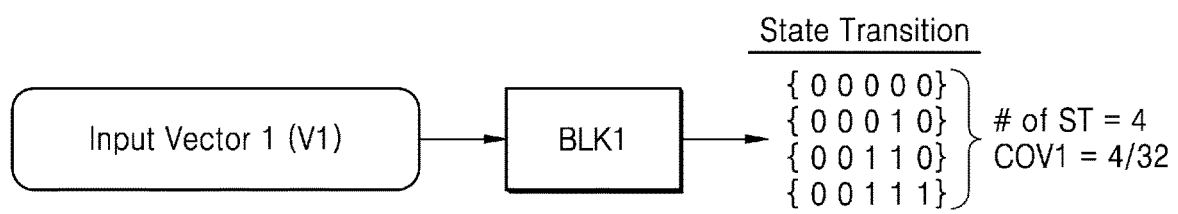
Case 2
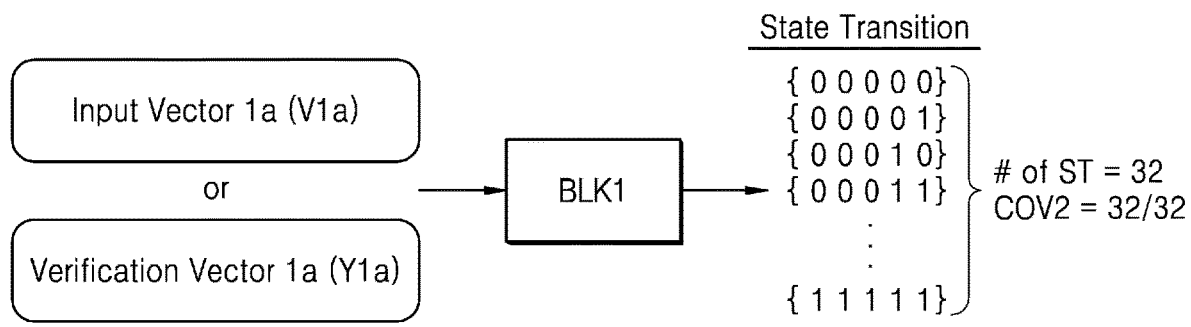

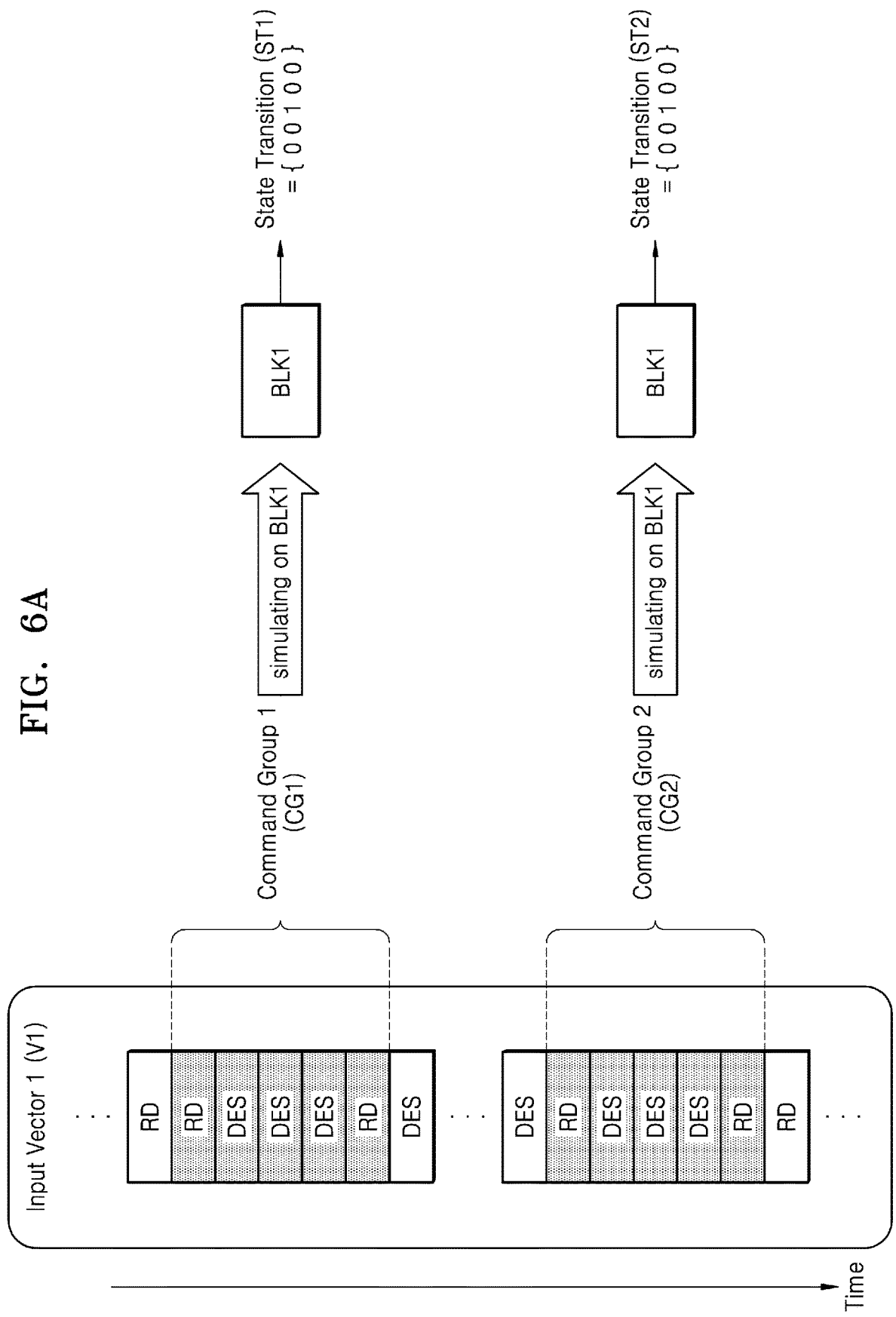

ELECTRONIC DEVICES GENERATING VERIFICATION VECTOR FOR VERIFYING SEMICONDUCTOR CIRCUIT AND METHODS OF OPERATING THE SAME

CROSS-REFERENCE TO RELATED APPLICATION

This application claims the benefit of Korean Patent Application No. 10-2019-0130822, filed on Oct. 21, 2019, in the Korean Intellectual Property Office, the disclosure of which is incorporated herein in its entirety by reference.

BACKGROUND

The present disclosure relates to electronic devices that verify a semiconductor circuit, and to methods of operating the electronic devices. As digital circuit design technology becomes more complicated and products become more diversified, a process of verifying a circuit design is becoming more complicated. As the verifying process increases in complexity, an amount (e.g., a size) of a verification vector may become undesirably large and unnecessary redundant verification processes may be generated. As a conventional method of solving the problem, a rule-based vector compression technique based on an experience of an engineer is provided. A length of a verification vector to be improved (e.g., optimized) may be reduced. However, since components of the verification vector may not be changed, the redundant verifications may be provided as they are. In addition, in compressing the verification vector, there are limitations on rule-based settings. Therefore, it may be difficult to optimize the length of the verification vector. Although a length of one verification vector may be is optimized, it may be difficult to perform rule-based optimization of an entire verification vector set in terms of time and expenses.

SUMMARY

The inventive concept provides an electronic device for generating an optimized verification vector with a high coverage and a decreased (e.g., minimized) length by using machine learning, in which duplicate commands with the same state transition of a semiconductor circuit are reduced (e.g., eliminated), and a method of operating the same.

According to an aspect of the inventive concept, there is provided an electronic device configured to generate a verification vector for verifying a semiconductor circuit including a first circuit block and a second circuit block, including a duplicate command eliminator configured to receive a first input vector including a plurality of commands and to provide a first converted vector, in which ones of the plurality of commands that generate the same state transition are changed into idle commands, based on a state transition of the first circuit block obtained by performing a simulation operation on the first input vector, a reduced vector generator configured to provide a first reduced vector in which a number of repetitions of the idle commands included in the first converted vector is reduced, and a verification vector generator configured to output the first reduced vector having a coverage that coincides with a target coverage, and further having a number of the idle commands that is smallest among a plurality of first reduced vectors, as a first verification vector.

According to an aspect of the inventive concept, there is provided an electronic device configured to generate a verification vector for verifying a semiconductor circuit including a first circuit block and a second circuit block, including a duplicate command eliminator configured to receive a first input vector including a plurality of commands and to provide a first converted vector, in which at least some of the plurality of commands included in the first input vector are changed into idle commands, a reduced vector generator configured to provide a first reduced vector in which a number of repetitions of the idle commands included in the first converted vector is reduced, and a verification vector generator configured to train an estimation model for estimating a first verification vector based on a number of the idle commands included in the first reduced vector and the coverage of the first reduced vector and to output the first reduced vector having a coverage that coincides with a target coverage, and further having the number of the idle commands that is smallest among a plurality of first reduced vectors, as the first verification vector based on the trained estimation model.

According to an aspect of the inventive concept, there is provided a method of operating an electronic device configured to generate a verification vector for verifying a semiconductor circuit including a first circuit block and a second circuit block, including receiving a first input vector including a plurality of commands, providing a first converted vector in which at least some of a plurality of commands included in the first input vector are changed into idle commands, providing a first reduced vector in which a number of repetitions of the idle commands included in the first converted vector is reduced, and selecting the first reduced vector having a coverage that coincides with a target coverage, and further having a number of the idle commands that is smallest among a plurality of first reduced vectors, as a first verification vector and outputting the first verification vector.

According to an aspect of the inventive concept, there is provided an electronic device configured to generate a verification vector for verifying a semiconductor circuit including a first circuit block and a second circuit block, including a duplicate command eliminator configured to receive a first input vector including a plurality of commands and to provide a first converted vector, in which at least some of the plurality of commands included in the first input vector are changed into idle commands, a reduced vector generator configured to provide a first reduced vector in which a number of repetitions of the idle commands included in the first converted vector is reduced, and a verification vector generator configured to select the first reduced vector having a coverage that coincides with a target coverage, and further having a number of the idle commands that is smallest among a plurality of first reduced vectors, as a first verification vector and to output the first verification vector.

BRIEF DESCRIPTION OF THE DRAWINGS

Embodiments of the inventive concept will be more clearly understood from the following detailed description taken in conjunction with the accompanying drawings in which:

FIG. 4B is a table illustrating a state transition according to an example embodiment of the inventive concept, FIG. 4C is a block diagram illustrating coverage according to an example embodiment of the inventive concept;

FIG. 6A is a block diagram illustrating a duplicate command eliminator according to an example embodiment of the inventive concept;

DETAILED DESCRIPTION

Hereinafter, embodiments of the inventive concept will be described in detail with reference to the accompanying drawings.

Figure 1:
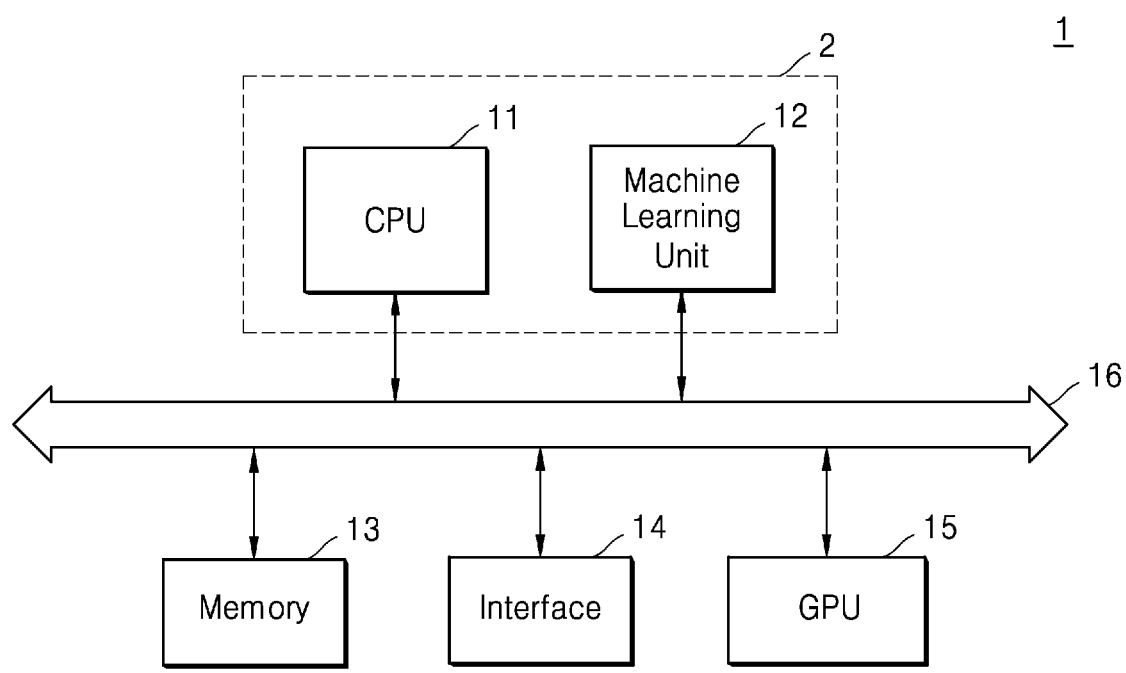
FIG. 1 is a block diagram illustrating an electronic system for generating a verification vector according to an example embodiment of the inventive concept.

FIG. 1 is a block diagram illustrating an electronic system 1 for generating a verification vector according to an example embodiment of the inventive concept.

Referring to FIG. 1, the electronic system 1 may include an electronic device 2, a memory 13, an interface 14, a graphics processing unit (GPU) 15, and a bus 16. The electronic device 2 may include a central processing unit (CPU) 11 and a machine learning unit 12. For example, the electronic device 2 may be implemented by a kind of processing unit. The electronic system 1 may further include an input and output module, a security module, a power control device, and various kinds of processors. According to an embodiment, some or all of the components (for example, the CPU 11, the machine learning unit 12, the memory 13, and the interface 14) of the electronic system 1 may be included in a semiconductor chip. For example, the electronic system 1 may be implemented by a system on chip (SoC). The components of the electronic system 1 may communicate with each other through the bus 16.

The CPU 11 controls an overall operation of the electronic system 1. The CPU 11 may include a processor core or a plurality of processor cores. The CPU 11 may process or execute programs and/or data stored in a storage region such as the memory 13.

For example, the CPU 11 may execute an application program and may control the machine learning unit 12 so as to perform machine learning based tasks required in accordance with execution of the application program. For example, machine learning may be performed by a neural network operation and a neural network may include at least one of various kinds of neural network models such as a convolution neural network (CNN), a region with convolution neural network (R-CNN), a region proposal network (RPN), a recurrent neural network (RNN), a stacking-based deep neural network (S-DNN), a state-space dynamic neural network (S-SDNN), a deconvolution network, a deep belief network (DBN), a restricted Boltzmann machine (RBM), a fully convolutional network, a long short-term memory (LSTM) network, and a classification network.

The machine learning unit 12 may perform machine learning and an operation in accordance with machine learning based on received input data. For example, the machine learning unit 12 may generate an information signal based on a result of performing the neural network operation. The machine learning unit 12 may be implemented by a neural network operation accelerator, a coprocessor, a digital signal processor (DSP), and an application specific integrated circuit (ASIC).

Figure 2:
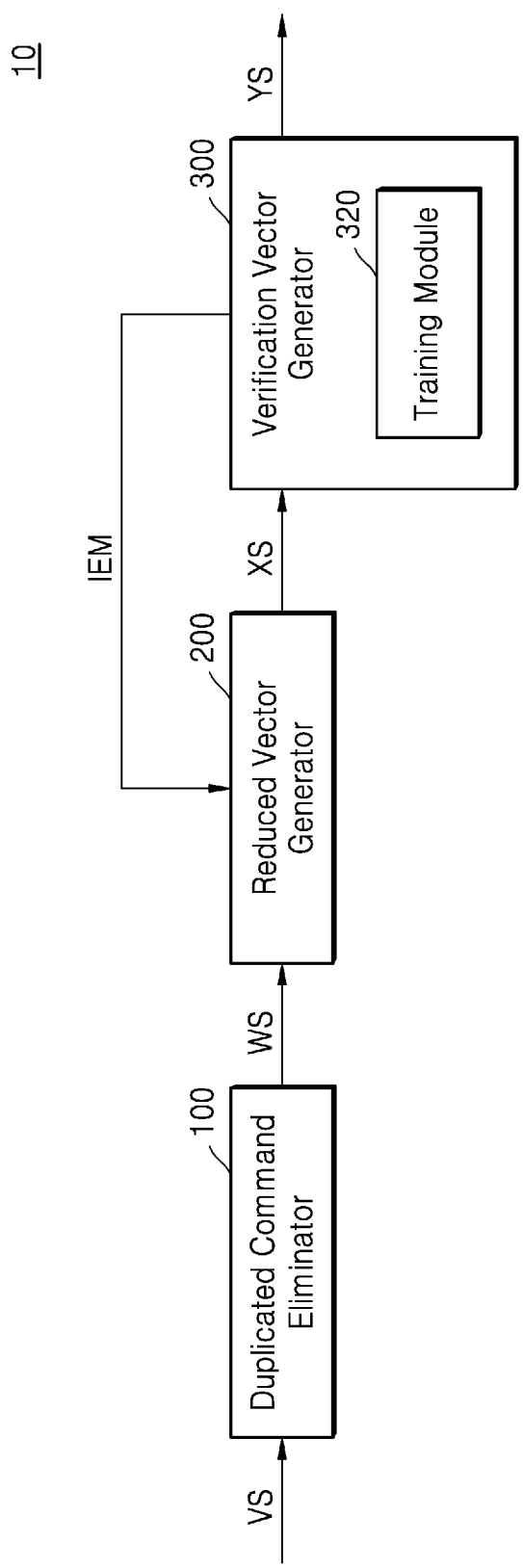
FIG. 2 is a block diagram illustrating an electronic device according to an example embodiment of the inventive concept.

Moreover, the electronic device 2 according to the current embodiment may include a duplicate command eliminator 100 (FIG. 2), a reduced vector generator 200 (FIG. 2), and a verification vector generator 300 (FIG. 2). For example, the machine learning unit 12 may process an operation for performing operations of the duplicate command eliminator 100, the reduced vector generator 200, and the verification vector generator 300. In another example, the CPU 11 may process an operation for performing the operation of the duplicate command eliminator 100 and the machine learning unit 12 may process an operation (for example, a learning operation) for performing the operations of the reduced vector generator 200 and the verification vector generator 300. For example, the duplicate command eliminator 100, the reduced vector generator 200, and the verification vector generator 300 may be implemented by software logics. In this case, the memory 13 may store the duplicate command eliminator 100, the reduced vector generator 200, and the verification vector generator 300 in non-transitory computer readable recording media. The CPU 11 and/or the machine learning unit 12 may execute the software logics stored in the memory 13.

The electronic system 1 generates a verification vector for verifying a semiconductor circuit to be verified, and the verification vector may optimize an input vector. The duplicate command eliminator 100 may receive the input vector and may provide a converted vector in which at least some of a plurality of commands included in the input vector are converted into idle commands. The input vector for verifying the semiconductor circuit repeatedly includes commands that cause the same state transition. Therefore, an amount of commands may be large. A state transition may mean a set of states (for example, represented as 0 or 1) that may be generated when an input vector or a verification vector is input to the semiconductor circuit. An idle command may mean a signal that does not include substantial data. For example, an idle command of DRAM may be a deselect DES command.

The reduced vector generator 200 may provide a reduced vector in which the number of repetitions of idle commands included in the converted vector output from the duplicate command eliminator 100 is controlled. For example, the converted vector may include a plurality of duplicate idle commands. Since the idle commands may not be for verifying the semiconductor circuit, the reduced vector generator 200 may eliminate the plurality of duplicate idle commands and may exchange the eliminated idle commands with subsequent commands (for example, read commands).

The verification vector generator 300 may select a reduced vector based on a number of idle commands and coverage among a plurality of reduced vectors. For example, the verification vector generator 300 may select the reduced vector having the smallest number of idle commands and the coverage that coincides with target coverage as the verification vector among the plurality of reduced vectors generated by the reduced vector generator 200. Meanwhile, the present disclosure is not limited thereto, and the transform vector generator 300 may determine the shortened vector in various ways based on the number and coverage of idle vectors. The selected verification vector may be optimized for verifying the semiconductor circuit. The coverage may be a value obtained by dividing the number of state transitions that may be generated by the verification vector by the number of all state transitions that may be generated by the semiconductor circuit. Detailed description will be made with reference to the following drawings.

The memory 13 may store programs and/or data used by the electronic system 1. The memory 13 may also store various parameters for machine learning, input data (for example, the input vector), and output data (for example, a state of a circuit block).

The memory 13 may be dynamic random access memory (DRAM). However, the inventive concept is not limited thereto. The memory 13 may include at least one of volatile memory and non-volatile memory. The non-volatile memory may be read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), or ferroelectric RAM (FRAM). The volatile memory may be DRAM, static RAM (SRAM), synchronous DRAM (SDRAM), phase-change RAM (PRAM), magnetic RAM (MRAM), resistive RAM (RRAM), or ferroelectric RAM (FeRAM). According to an embodiment, the memory 13 may include at least one of a hard disk drive (HDD), a solid state drive (SSD), a compact flash (CF) card, a secure digital (SD) card, a micro secure digital (micro-SD) card, a mini secure digital (mini-SD) card, an extreme digital (xD) card, and a memory stick.

The interface 14 may communicate information about the semiconductor circuit to be verified. For example, the interface 14 may receive information about a circuit design generated by a circuit design device or a circuit design system in which the electronic system 1 is mounted and may provide the received information to the electronic device 2. For example, the machine learning unit 12 may perform simulation for learning by using information about the circuit design.

The GPU 15 may accelerate an operation of the electronic system 1. A GPU may include a plurality of processor cores, may operate in connection with another GPU through a CPU, PCI-e, and NVLINK, and may accelerate a general purpose operation through a compute unified device architecture (CUDA). The GPU 15 may process or execute the programs and/or data stored in the storage region such as the memory 13.

The electronic system 1 may receive the input vector in order to generate an optimized verification vector. By performing training (or learning) based on the input vector or analyzing the input vector, the electronic system 1 may infer information included in the input data. The electronic system 1 may control components of the electronic device in which the electronic system 1 is mounted so as to maintain high coverage and to eliminate unnecessary commands based on the inferred information. For example, the electronic system 1 may be applied to the circuit design device or the circuit design system for designing a circuit and verifying the designed circuit and may be mounted in one of various kinds of electronic devices.

The electronic system 1 according to an example embodiment of the inventive concept may reduce an amount of a vector by reducing meaningless/redundant commands of an input vector, which cause redundant state transitions to an optimized number of times by using machine learning and may improve quality of a verification operation by reducing the amount of operations and excluding redundant verification operations.

FIG. 2 is a block diagram illustrating an electronic device 10 according to an example embodiment of the inventive concept.

Referring to FIG. 2, the electronic device 10 may include the duplicate command eliminator 100, the reduced vector generator 200, and the verification vector generator 300, and the verification vector generator 300 may include a training module 320. The electronic device 10 may be included as a part or all of the electronic device 2 described above with reference to FIG. 1.

The duplicate command eliminator 100 may receive an input vector set VS and may provide a converted vector set WS. The reduced vector generator 200 may receive the converted vector set WS and may provide a reduced vector set XS. The verification vector generator 300 may receive the reduced vector set XS and may output a verification vector set YS.

The reduced vector generator 200 may provide a reduced vector in which the number of repetitions of idle commands included in a converted vector of the converted vector set WS is controlled and the reduced vector may be included in the reduced vector set XS. For example, in order to generate the verification vector set YS in which an amount of vectors is optimized, the reduced vector generator 200 may reduce the number of repetitions of idle commands and an amount of reductions may be determined based on information about an estimation model IEM received from the verification vector generator 300.

The verification vector generator 300 may train the estimation model IEM for estimating the verification vector based on the number of idle commands included in the reduced vector and coverage of the reduced vector. For example, the training module 320 generates a first function value in accordance with a first function (for example, a decreasing function) when the coverage of the reduced vector coincides with the target coverage, generates a second function value in accordance with a second function (for example, a constant function having a value greater than the first function value) when the coverage of the reduced vector is less than the target coverage, and may train an estimation model IEM having the first function value and the second function value. The verification vector generator 300 may provide the information about the trained estimation model IEM to the reduced vector generator 200.

The reduced vector generator 200 may draw an acquisition function based on the information about the estimation model IEM and may provide a reduced vector having the number of idle commands having the highest probability value in the acquisition function to the verification vector generator 300. The verification vector generator 300 may determine whether the coverage of the received reduced vector coincides with the target coverage and may output a reduced vector having the coverage that coincides with the target coverage and the smallest number of idle commands as the verification vector.

Moreover, the duplicate command eliminator 100 may receive the input vector set VS for generating the verification vector set YS. Hereinafter, a plurality of vectors included in the input vector set VS, the converted vector set WS, the reduced vector set XS, and the verification vector set YS will be described with reference to FIG. 3.

Figure 3:
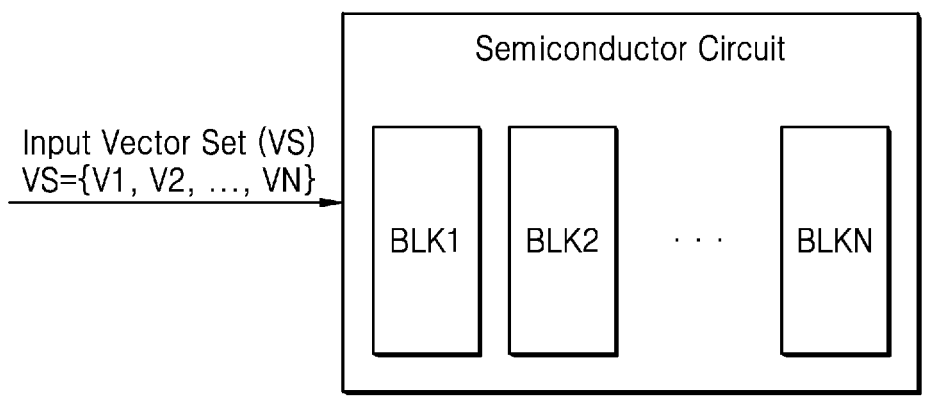
FIG. 3 is a block diagram illustrating a semiconductor circuit including a plurality of circuit blocks and an input vector according to an example embodiment of the inventive concept.

FIG. 3 is a block diagram illustrating a semiconductor circuit including a plurality of circuit blocks and an input vector according to an example embodiment of the inventive concept.

Referring to FIGS. 2 and 3, the input vector set VS may include a plurality of input vectors V1 to VN. Each of the plurality of input vectors V1 to VN may verify a plurality of circuit blocks BLK1 to BLKN. Placement positions, purposes, functions, and circuit characteristics of the plurality of circuit blocks BLK1 to BLKN may be different from each other. Therefore, kinds and orders of at least some of a plurality of commands included in the plurality of input vectors V1 to VN may be different from each other. For example, when the semiconductor circuit to be verified is a memory device or a memory controller, a command may operate the memory device. However, the semiconductor circuit to be verified is not limited to the memory device or the memory controller and the command may operate various kinds of semiconductor circuits.

Like the input vector set VS, the converted vector set WS may include a plurality of converted vectors (for example, N converted vectors), the reduced vector set XS may include a plurality of reduced vectors (for example, N reduced vectors), and the verification vector set YS may include a plurality of verification vectors (for example, N verification vectors). The plurality of verification vectors may be optimized vectors for verifying the plurality of circuit blocks BLK1 to BLKN.

Referring to FIG. 2 again, the duplicate command eliminator 100 may provide a converted vector, in which a plurality of commands that generate the same state transition are changed into idle commands, based on a state transition of the circuit block BLK1 (FIG. 2) obtained by performing a simulation operation on the input vector V1 (FIG. 2). The duplicate command eliminator 100 may change a plurality of commands that generate the same state transition and that do not substantially contribute to verification of a semiconductor circuit into idle commands. A state transition will be described in detail with reference to FIG. 4.

Figure 4A:
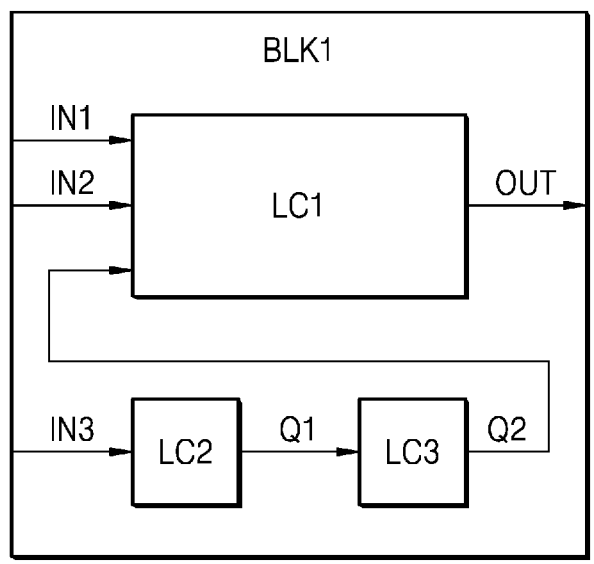
FIG. 4A is a block diagram illustrating a state transition according to an example embodiment of the inventive concept.

FIG. 4A is a block diagram illustrating a state transition according to an example embodiment of the inventive concept, FIG. 4B is a table illustrating a state transition according to an example embodiment of the inventive concept, and FIG. 4C is a block diagram illustrating coverage according to an example embodiment of the inventive concept.

Referring to FIGS. 2 and 4A, the first circuit block BLK1 may include a plurality of logic circuits LC1 to LC3. A state of the first circuit block BLK1 may be defined as inputs or outputs of the plurality of logic circuits LC1 to LC3. In detail, the state of the first circuit block BLK1 may be defined as inputs IN1 and IN2 of the logic circuit LC1, an input IN3 and an output Q1 of the logic circuit LC2, and an output Q2 of the logic circuit LC3.

Referring to FIG. 4B, 32 state transitions of the first circuit block BLK1 may be obtained as illustrated in a table ST_TB. That is, the state transitions may mean states of the plurality of inputs IN1 to IN3 and the plurality of outputs Q1 and Q2. The first circuit block BLK1 may have a state transition that may not be generated by the circuit design. Such a case may be considered when coverage is operated. A coverage according to example embodiments of the inventive concept may be determined in units of circuit blocks and may not be determined by observing only a state transition of a node in a circuit block but by observing a change in combination of some or all of inputs or outputs of logic circuits in the circuit block. The state of the first circuit block BLK1 may be defined by inputs or outputs of logic circuits that form a counter (for example, a refresh counter in DRAM) in the first circuit block BLK1, a read command first in first out (FIFO), and a write command FIFO.

Referring to FIG. 4C, for example, state transitions ST of the first circuit block BLK1 by the first input vector V1 may include '0 0 0 0 0', '0 0 0 1 0', '0 0 1 1 0', and '0 0 1 1 1'. That is, the number of state transitions ST of the first circuit block BLK1 may be 4. In this case, since the number of all possible state transitions ST of the first circuit block BLK1 is 32, a coverage COV1 of the first circuit block BLK1 by the first input vector V1 may be 4/32 and may be less than 1.

In another example, the number of state transitions ST of the first circuit block BLK1 by a first input vector V1*a* may be 32. In addition, since the number of all possible state transitions ST of the first circuit block BLK1 is 32, a coverage COV2 of the first circuit block BLK1 by the first input vector V1*a* may be 32/32=1. The coverage COV2 of the first circuit block BLK1 by a first verification vector Y1*a* may be 32/32=1. Here, the first verification vector Y1*a* may be generated based on the first input vector V1*a*. For example, the electronic device 10 may change commands that cause the same state transition into idle commands and may reduce the number of changed idle commands based on the first input vector V1*a* having a coverage of 1. The electronic device 10 may generate a plurality of reduced vectors in which the number of idle commands is reduced. At least some of the plurality of reduced vectors may have different coverages. In some of the plurality of reduced vectors, the numbers of idle commands may vary. The electronic device 10 may output a vector with a coverage that coincides with the target coverage (for example, a value of the target coverage is 1) among the plurality of reduced vectors, in which the number of idle commands is minimized, as the verification vector Y1*a*. In this case, an operation of the electronic device 10 changing commands that cause the same state transition into idle commands will be described with reference to FIGS. 5, 6A, and 6B.

Figure 5:
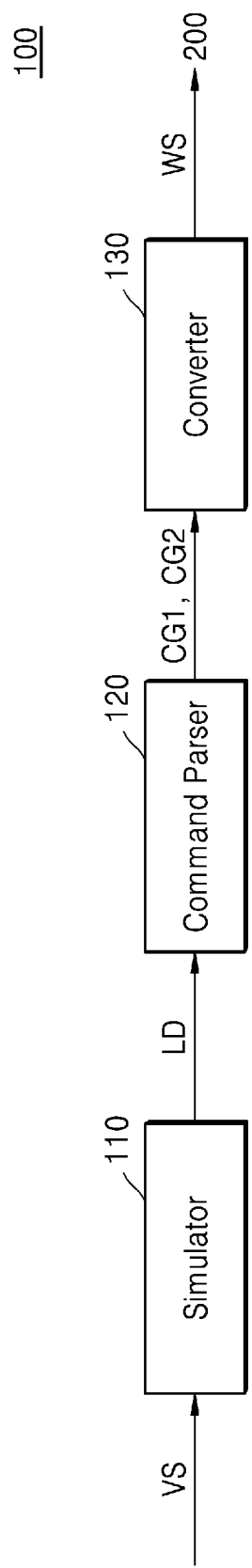
FIG. 5 is a block diagram illustrating a duplicate command eliminator according to an example embodiment of the inventive concept.

FIG. 5 is a block diagram illustrating a duplicate command eliminator 100 according to an example embodiment of the inventive concept.

Referring to FIG. 5, the duplicate command eliminator 100 may include a simulator 110, a command parser 120, and a detector 130. The duplicate command eliminator 100 may receive the input vector set VS including a plurality of input vectors and may provide the converted command set WS including converted commands in which a command that forms at least one vector among input vectors is changed. For convenience sake, with reference to FIGS. 6A and 6B, the duplicate command eliminator 100 will be described.

FIG. 6A is a block diagram illustrating the duplicate command eliminator 100 according to an example embodiment of the inventive concept.

Referring to FIGS. 5 and 6A, the duplicate command eliminator 100 may change commands that cause the same state transition into idle commands DES among the plurality of commands included in the first input vector V1. Hereinafter, the plurality of commands may be referred to as a command group. For example, in the first input vector V1, various kinds of commands may be listed in time series. For example, the commands may include read commands RD, idle commands DES, write commands, and refresh commands. For convenience sake, it is illustrated that the semiconductor circuit to be verified is the memory controller or the memory device. However, the inventive concept is not limited thereto. Like the idle commands DES, various kinds of commands that do not instruct substantial data operations may be included and, like the read commands RD, various kinds of commands that instruct substantial data operations may be included.

According to an example embodiment of the inventive concept, the duplicate command eliminator 100 may obtain first state transitions ST1 each having a value of '0 0 1 0 0' as a result of simulating a first command group CG1. In addition, the duplicate command eliminator 100 may obtain second state transitions ST2 each having the value of '0 0 1 0 0' as a result of simulating a second command group CG2. The first state transitions ST1 may be generated by the first command group CG1 and the second state transitions ST2 may be generated by the second command group CG2. The first state transitions ST1 and the second state transitions ST2 may have the same value. The first state transitions ST1 may be generated before the second state transitions ST2 are generated.

Figure 6B:
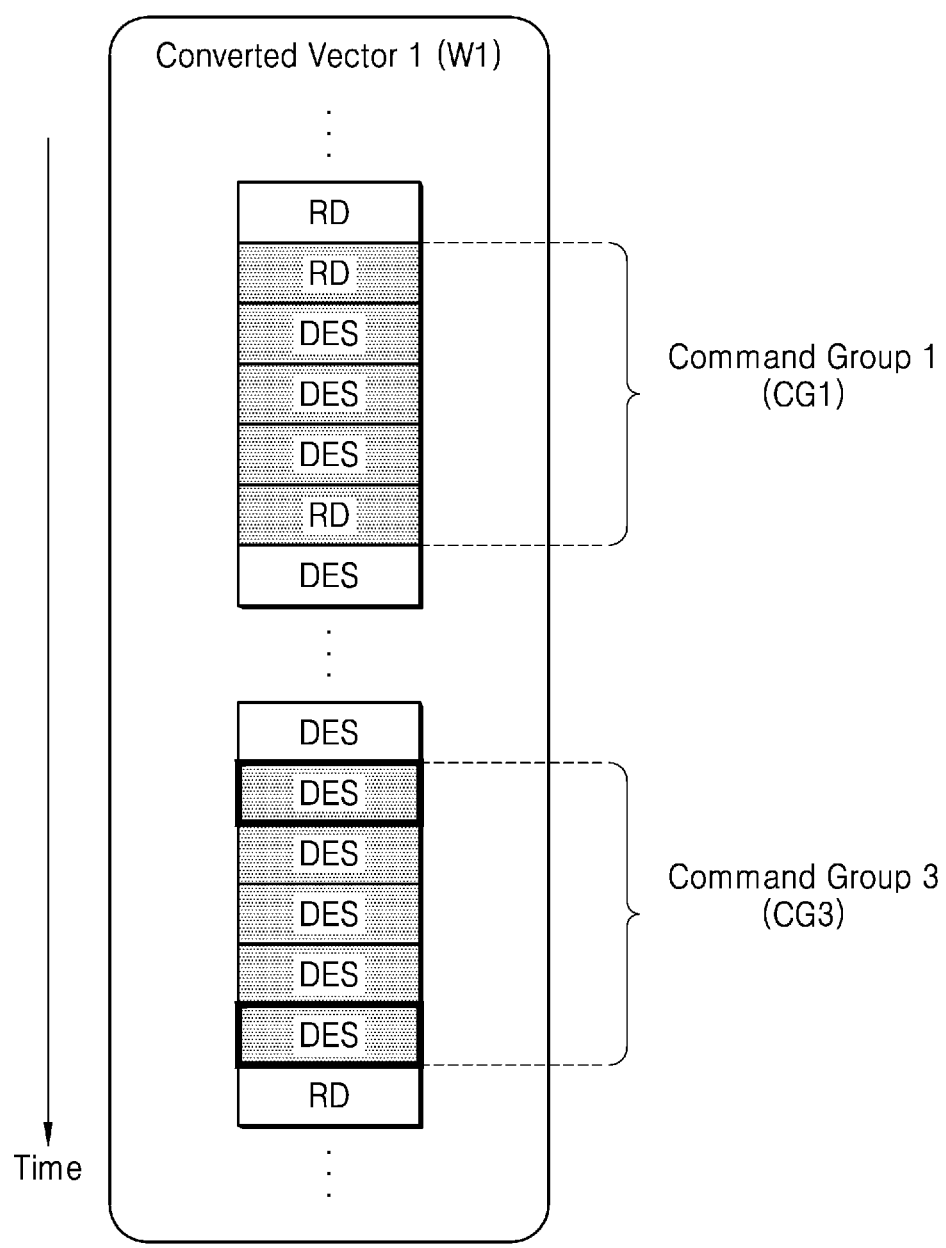
FIG. 6B is a block diagram illustrating a converted vector according to an example embodiment of the inventive concept.

FIG. 6B is a block diagram illustrating a converted vector according to an example embodiment of the inventive concept.

Referring to FIGS. 5, 6A, and 6B, the duplicate command eliminator 100 may change commands corresponding to the second state transitions ST2 excluding (i.e., other than) the earliest generated first state transition ST1 into idle commands DES among the plurality of same state transitions.

According to an example embodiment of the inventive concept, the simulator 110 may simulate the first input vector V1 on the first circuit block BLK1. The simulator 110 may include, for example, a Verilog simulator. The simulator 110 may output a simulation log LD as a simulation result. The simulator 110 may record at least one of information about a time at which a particular command is simulated on a circuit block, a state transition generated by the particular command, information about a time at which the state transition is generated, and the particular command in the simulation log LD.

For example, the simulator 110 may record information about time(s) at which the first command group CG1 is simulated on the first circuit block BLK1 and the first state transitions ST1 in the simulation log LD. In another example, the simulator 110 may record information about time(s) at which the second command group CG2 is simulated on the first circuit block BLK1 and the second state transitions ST2 in the simulation log LD. That is, the plurality of same state transitions ST1 and ST2 may be recorded in the simulation log LD obtained by simulating the first input vector V1 on the first circuit block BLK1.

Referring to FIGS. 5 and 6A, the command parser 120 may distinguish commands that cause the same state transitions based on the simulation log LD. The command parser 120 may distinguish the first command group CG1 and the second command group CG2 that cause the first state transitions ST1 and the second state transitions ST2. In detail, the command parser 120 may distinguish information items on kinds and times of the plurality of commands included in the first command group CG1 and the second command group CG2. The command parser 120 may transmit information about the first command group CG1 and the second command group CG2 to the converter 130.

Referring to FIGS. 5, 6A, and 6B, the converter 130 may generate a first converted vector W1 in which a plurality of commands (for example, commands included in the second command group CG2) that generate the same state transition are changed into idle commands DES. The converter 130 may generate second to Nth converted vectors corresponding to the second to Nth circuit blocks BLK2 to BLKN (FIG. 3) like the first converted vector W1. The converter 130 may provide the converted vector set WS including first to Nth converted vectors to the reduced vector generator 200.

Figure 7:
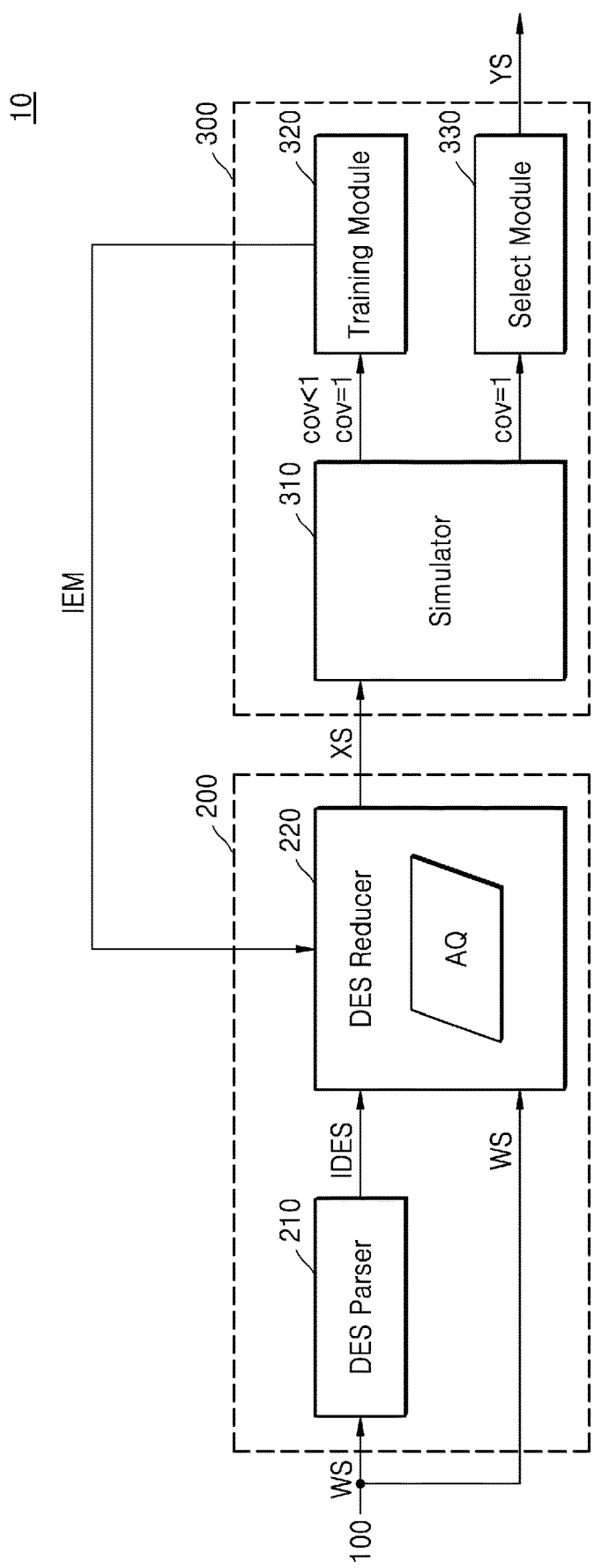
FIG. 7 is a block diagram illustrating a reduced vector generator and a verification vector generator according to an example embodiment of the inventive concept.

FIG. 7 is a block diagram illustrating the reduced vector generator 200 and the verification vector generator 300 according to an example embodiment of the inventive concept.

The electronic device 10 may include the reduced vector generator 200 and the verification vector generator 300. The reduced vector generator 200 may include an idle command parser 210 and an idle command reducer 220, and the verification vector generator 300 may include a simulator 310, a training module 320, and a select module 330.

The reduced vector generator 200 may receive the converted vector set WS, and the converted vector set WS may include a plurality of converted vectors. The reduced vector generator 200 may output reduced vectors in which the number of repetitions of idle commands included in converted vectors is controlled, and the reduced vector set XS may include a plurality of reduced vectors.

The idle command parser 210 may detect information items on idle commands, the number of repetitions of idle commands, and time at which commands in converted vectors are generated from the converted vectors included in the converted vector set WS. The idle command parser 210 may output information (that is, idle command information IDES) about time(s) for which repeated idle commands are positioned in converted vectors based on the detected information items.

Referring to FIGS. 6B and 7, the idle command parser 210 may distinguish idle commands DES included in the first converted vector W1 and may detect the number of repetitions of idle commands DES and time at which commands are generated. Referring to a third command group CG3, the idle command parser 210 may detect that idle commands DES are repeated five times and may detect time at which the idle commands DES are generated. Since the repeated idle commands DES increase only an amount of vectors and do not contribute to a substantial verification operation, the reduced vector generator 200 may reduce the number of repetitions of idle commands DES.

The idle command reducer 220 may generate reduced vectors based on the idle command information IDES and the information about the estimation model IEM. For example, the idle command reducer 220 may reduce (e.g., eliminate) at least some of the idle commands DES included in the converted vector (for example, W1) by a predetermined amount of reduction and may advance commands subsequent to the eliminated idle commands DES.

The idle command reducer 220 may determine the number of idle commands of reduced vectors based on the acquisition function AQ. That is, the idle command reducer 220 may reduce the number of idle commands of the reduced vectors based on the acquisition function AQ. The acquisition function AQ may be based on expected improvement (EI) of a Bayesian optimization algorithm. However, the inventive concept is not limited thereto. The acquisition function AQ will be described later with reference to FIGS. 8A and 8B. The idle command reducer 220 may determine the number of most likely idle commands on/from the acquisition function AQ based on the information about the estimation model IEM. As the number of times training of the estimation model IEM increases, the number of most likely idle commands on/from the acquisition function AQ may be reduced.

The simulator 310 may receive a reduced vector, may compare a coverage of the reduced vector with a target coverage, and may provide the comparison result to the training module 320. When a coverage of an input vector coincides with the target coverage, a coverage of a reduced vector included in the reduced vector set XS may not coincide with the target coverage. For example, when the reduced vector generator 200 reduces idle commands, the reduced vector may have a state transition different from what the input vector has. In this case, although the coverage of the input vector coincides with the target coverage, the coverage of the reduced vector may be less than the target coverage. Therefore, in order to check whether the coverage of the received reduced vector coincides with the target coverage, the simulator 310 may perform a simulated operation on the reduced vector. For example, a value of the target coverage may be 1.

The simulator 310 may obtain the coverage of the reduced vector by simulating the reduced vector on the circuit block. As described above, the coverage of the reduced vector may be a value obtained by dividing the number of state transitions that may be generated (i.e., possible state transitions) when the reduced vector is input to the circuit block by the number of all state transitions that may be generated (i.e., possible state transitions) by the circuit block.

The training module 320 may feedback the information about the estimation model IEM to the idle command reducer 220 after the estimation model IEM is trained. Moreover, the simulator 310 may perform a function similar to that of the simulator 110 described above with reference to FIG. 5. For example, the simulator 310 may calculate the state transition and coverage in accordance with the reduced vector by simulating the reduced vector on a prescribed circuit block.

Moreover, the verification vector generator 300 may train the estimation model IEM by a preset number of times (i.e., a predetermined number of instances) of training. The verification vector generator 300 may output a detection vector when the actual number of times of training of the estimation model IEM is greater than the preset number of times of training. In detail, the verification vector generator 300 may cumulatively receive reduced vectors having a number that coincides with the prescribed number of times of training and the select module 330 may output a reduced vector with a coverage cov of 1, in which the number of idle commands is smallest, as a verification vector among a plurality of reduced vectors received by the verification vector generator 300.

Figure 8A:
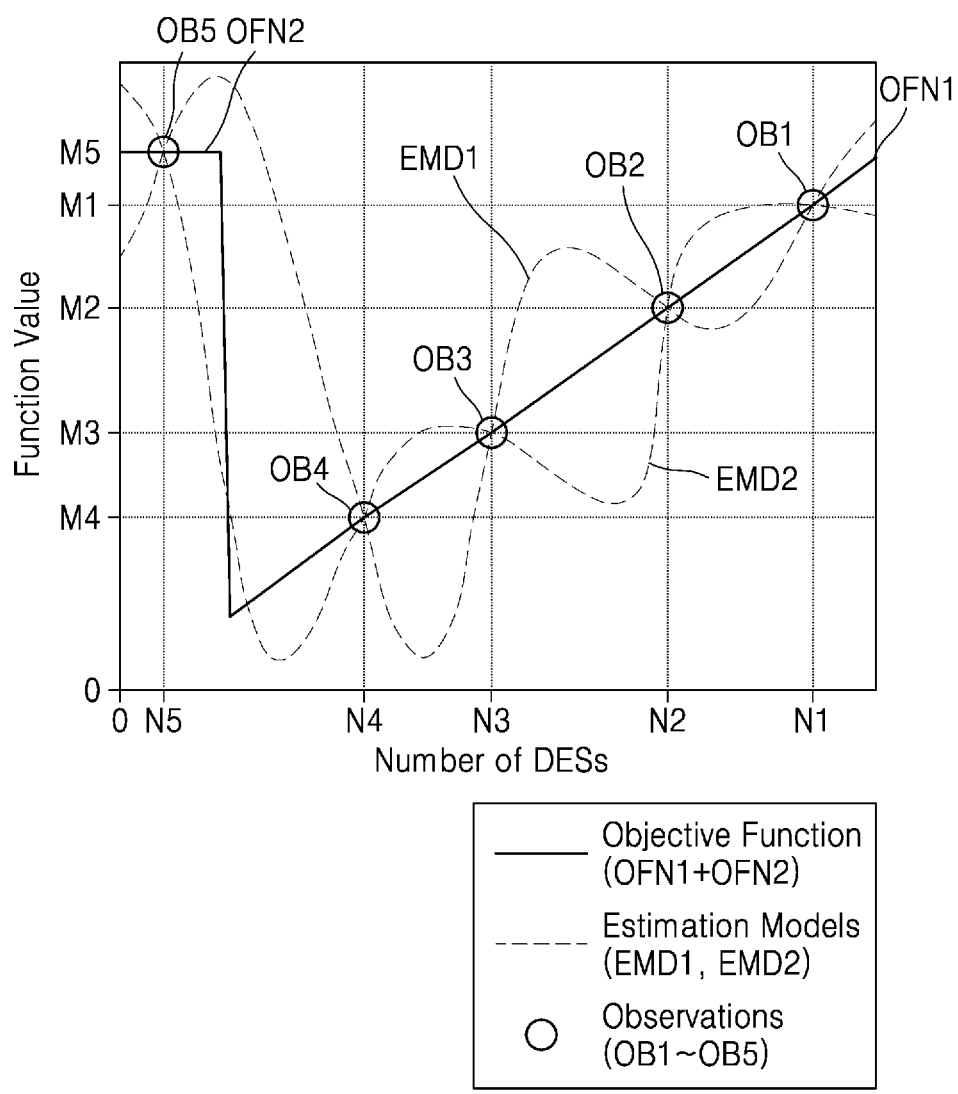
FIGS. 8A and 8B are optimization models for illustrating an operation of a verification vector generator according to an example embodiment of the inventive concept.
Figure 8B:
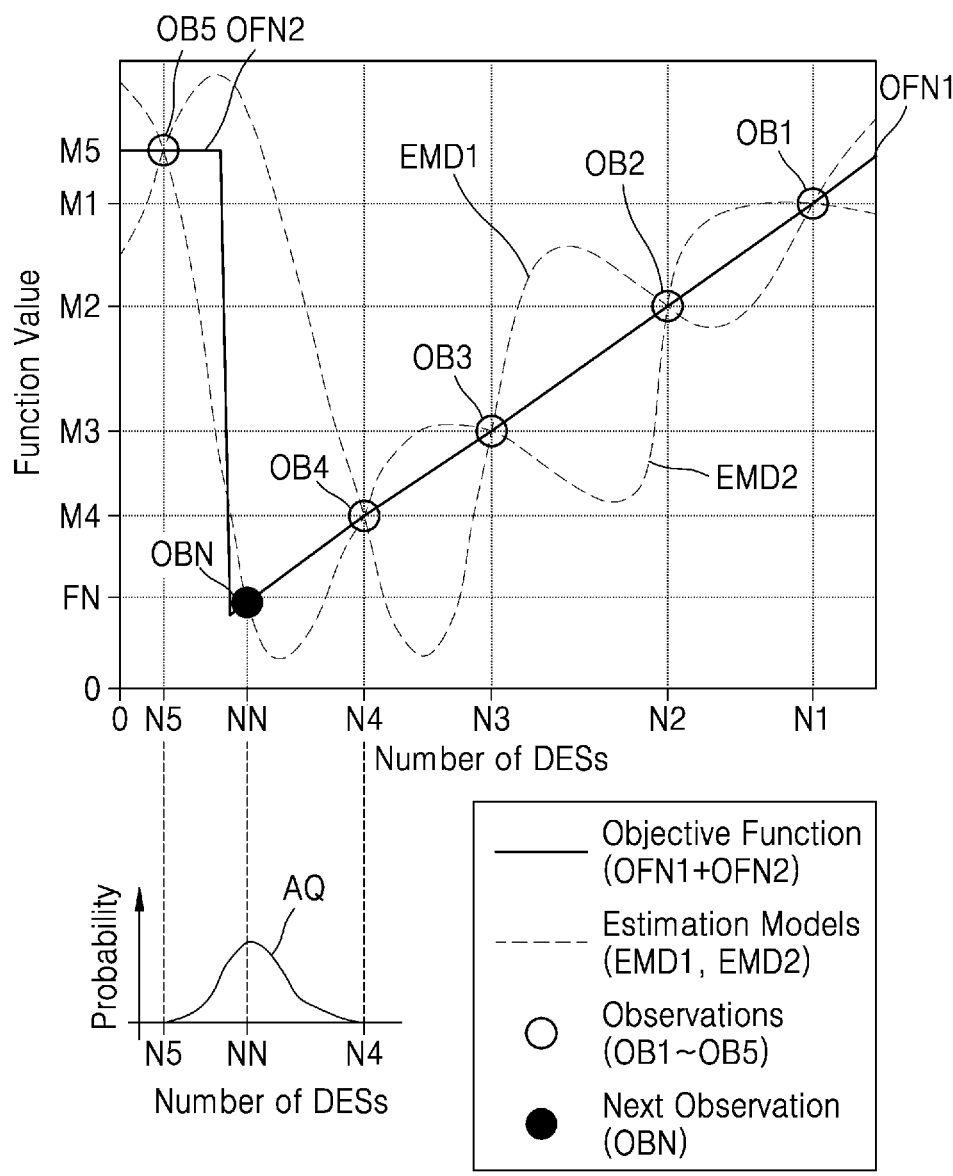

FIGS. 8A and 8B are optimization models for illustrating an operation of the verification vector generator 300 according to an example embodiment of the inventive concept.

Referring to FIGS. 8A and 8B, the horizontal axis of the optimization model represents the number of idle commands DES included in a reduced vector and the vertical axis represents a function value. A solid line in the optimization model means an objective function, and the objective function may be ideally optimized. Dashed lines in the optimization model indicate estimation models, and the verification vector generator 300 may generate the estimation models close to the objective function by repeatedly training the estimation models. For example, the estimation models generated by the verification vector generator 300 through repeated training may be more similar to the objective function than the estimation models initially generated by the verification vector generator 300. Circles in the optimization model indicate observation points. For example, when the reduced vector includes N1 idle commands DES, the verification vector generator 300 may generate a first observation point OB1.

The verification vector generator 300 may repeatedly train the estimation models in order to find out (e.g., identify) a minimum value of the objective function or a minimum value of the number of idle commands DES. Hereinafter, a process of searching for a verification vector in which the number of idle commands DES is minimized based on the Bayesian optimization algorithm will be described. Therefore, the estimation model may be a surrogate model. For example, the surrogate model may include at least one of a Gaussian process (GP), a tree-structured Parzen estimator (TPE), and a neural network. In addition, the acquisition function AQ to be described later may include at least one of probability of improvement (PI), expected improvement (EI), upper confidence bound (UCB), and entropy search (ES).

Referring to FIGS. 7 and 8A, when the coverage of the reduced vector coincides with the target coverage, the training module 320 may generate a first function value in accordance with a first function OFN1. That is, the training module 320 may have the N1 idle commands DES, may receive the reduced vector having the coverage that coincides with the target coverage, and may generate the first observation point OB1 having a function value of M1. Then, the training module 320 may receive reduced vectors respectively having N2, N3, and N4 idle commands DES and may generate a second observation point OB2, a third observation point OB3, and a fourth observation point OB4 respectively having function values of M2, M3, and M4. Each of the received reduced vectors may have a coverage that coincides with the target coverage.

For example, N1 to N4 that are the numbers of idle commands DES may be respectively function values M1 to M4. That is, the training module 320 may set the first function OFN1 as y (i.e., vertical axis)=x (i.e., horizontal axis). In another example, the training module 320 may set the first function OFN1 as one of various functions reduced as the number of idle commands DES is smaller. For example, the first function OFN1 may include $y=x^2$ (if $x>0$) or $y=e^x$ (if, $x>0$).

Moreover, the training module 320 may generate the second function value in accordance with a second function OFN2 when the coverage of the reduced vector is less than the target coverage. That is, the training module 320 may have N5 idle commands DES, may receive the reduced vector having the coverage less than the target coverage, and may generate a fifth observation point OB5 having a function value of M5. For example, the second function OFN2 may be a constant function having a value greater than the first function values M1 to M4. This is because the reduced vector having the coverage less than the target coverage is not to be selected as a verification vector.

The training module 320 may generate a plurality of estimation models EMD1 and EMD2. For example, after receiving the reduced vector having the N5 idle commands DES, the second estimation model EMD2 may be generated. Based on the second estimation model EMD2, the training module 320 may determine that a function value may be minimized when the number of idle commands DES is greater than N5 and less than N4. Therefore, the training module 320 may provide the numbers N5 and N4 of idle commands DES to the idle command reducer 220 as the information about the estimation model IEM. That is, the information about the estimation model IEM may include information about the number of idle commands DES.

Referring to FIGS. 7 and 8B, the idle command reducer 220 may determine NN that is the number of most likely idle commands DES from the acquisition function AQ based on the information about the estimation model IEM. For example, the acquisition function AQ may be related to probability. In the acquisition function AQ, a probability variable having the greatest probability value may be an optimal variable. The idle command reducer 220 may reduce the number of idle commands DES included in the reduced vector to NN based on the acquisition function AQ. The idle command reducer 220 may provide the reduced vector in which the number of idle commands DES is reduced to NN to the simulator 310. The simulator 310 may determine that the coverage of the received reduced vector coincides with the target coverage. Then, the training module 320 may generate the Nth observation point OBN having a function value FN in accordance with the first function OFN1. The simulator 310 may determine that the number of times of training by the training module 320 is greater than a prescribed number of times in response to the generation of the Nth observation point OBN. In this case, the select module 330 may output a reduced vector with a coverage that is the same as the target coverage, in which the number of idle commands DES is smallest, as a verification vector among received reduced vectors having a number that coincides with the number of times of training. The verification vector set YS may include a plurality of verification vectors.

Figure 9:
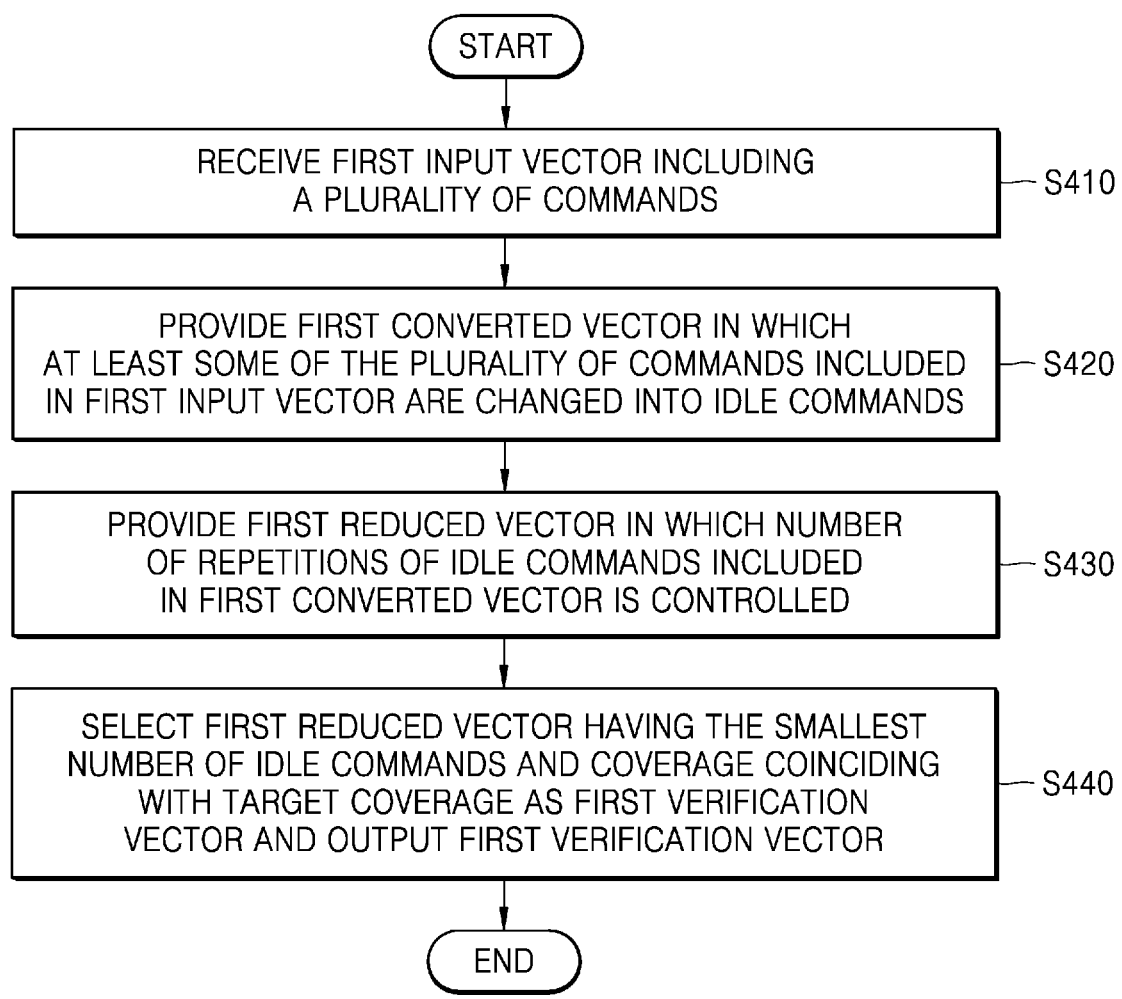
FIG. 9 is a flowchart illustrating a method of operating an electronic device, according to an example embodiment of the inventive concept.

FIG. 9 is a flowchart illustrating a method of operating the electronic device 10 according to an example embodiment of the inventive concept.

Referring to FIG. 9, the electronic device 10 (FIG. 2) may receive first input vectors including a plurality of commands in operation S410. For example, an input vector may be optimized as a verification vector. A plurality of commands may be input in order to operate a semiconductor circuit to be verified. For example, a first input vector may be for testing a first logic circuit among a plurality of logic circuits included in the semiconductor circuit.

The electronic device 10 may provide a first converted vector in which at least some of a plurality of commands included in the first input vector are changed into idle commands in operation S420. According to an example embodiment of the inventive concept, the electronic device 10 may change a plurality of commands that generate the same state transition into idle commands based on a state transition of a first circuit block obtained by performing a simulation operation on the first input vector.

The electronic device 10 may provide a first reduced vector in which the number of repetitions of idle commands included in the first converted vector is controlled in operation S430. For example, the electronic device 10 may control the number of repetitions of idle commands included in the first converted vector by the number of times of most likely idle commands on/from the acquisition function based on the information about the trained estimation model.

The electronic device 10 may select a first reduced vector with a coverage that coincides with a target coverage, in which the number of idle commands is smallest, as a first verification vector and may output the first verification vector in operation S440. According to an example embodiment of the inventive concept, the electronic device 10 may train an estimation model for estimating the first verification vector based on the number of idle commands included in the first reduced vector and the coverage of the first reduced vector. For example, the electronic device 10 may generate a value of an objective function that varies in accordance with the number of idle commands and coverage of the first reduced vector and may train the estimation model in accordance with the generated function value. For example, the estimation model may be the surrogate model in accordance with the Bayesian optimization algorithm. The electronic device 10 may output the first verification vector by selecting the first reduced vector with the coverage that coincides with the target coverage, in which the number of idle commands is smallest, based on the trained estimation model.

Figure 10:
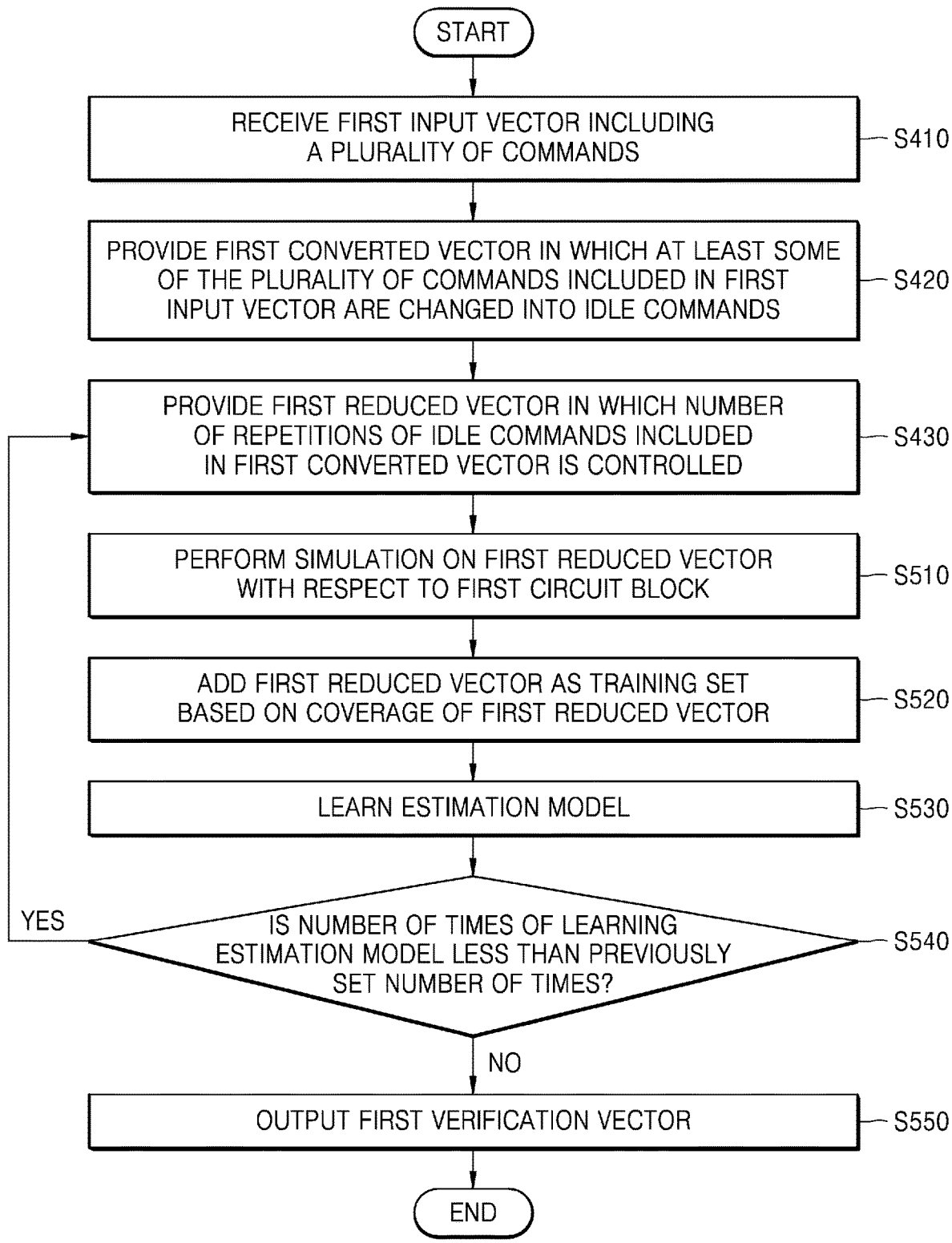
FIG. 10 is a flowchart illustrating a method of operating an electronic device, according to an example embodiment of the inventive concept.

FIG. 10 is a flowchart illustrating a method of operating an electronic device, according to an example embodiment of the inventive concept. Description previously given with reference to FIG. 9 may be omitted.

The electronic device 10 (FIG. 2) may perform simulation on the generated first reduced vector with respect to a first circuit block in operation S510. This is for selecting the first reduced vector having a coverage that coincides with the target coverage. The electronic device 10 may calculate the coverage of the first reduced vector by performing simulation.

The electronic device 10 may add the first reduced vector as a training set based on the coverage of the first reduced vector in operation S520. For example, the electronic device 10 may differently add the first reduced vector as the training set when the coverage of the first reduced vector coincides with the target coverage and when the coverage of the first reduced vector is less than the target coverage. The training set may be training data for training the estimation model. Then, the electronic device 10 may train the estimation model based on the training set in operation S530.

The electronic device 10 may determine whether the number of times of training the estimation model is less than the prescribed number of times in operation S540 and, when it is determined that the number of times of training the estimation model is less than the prescribed number of times, may generate a new first reduced vector based on the trained estimation model. The electronic device 10 may output the first verification vector when the number of times training the estimation model is greater than (or equal to) the prescribed number of times in operation S550. The first verification vector may be the first reduced vector of which the coverage is the target coverage, in which the number of repetitions of idle commands is smallest among the first reduced vectors generated by the prescribed number of times.

Figure 11:
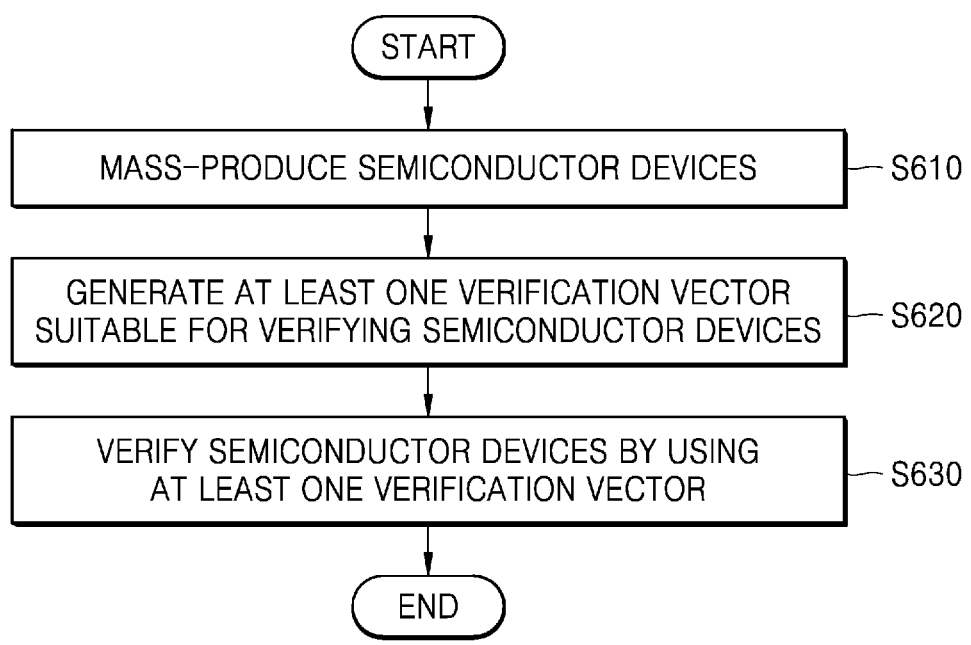
FIG. 11 is a flowchart illustrating a method of verifying mass-produced semiconductor devices, according to an example embodiment of the inventive concept.

FIG. 11 is a flowchart illustrating a method of verifying mass-produced semiconductor devices, according to an example embodiment of the inventive concept.

Referring to FIG. 11, the semiconductor devices are mass-produced (e.g., manufactured/built) in operation S610 and the electronic device according to embodiments of the inventive concept may generate at least one verification vector suitable for verifying the semiconductor devices in operation S620. The electronic device 10 (FIG. 2) may be a part or all of test equipment. In an embodiment, the test equipment may receive an input vector for generating at least one verification vector from the outside (e.g., external to the test equipment). The test equipment may verify the mass-produced semiconductor devices by using at least one verification vector in operation S630.

Figure 12:
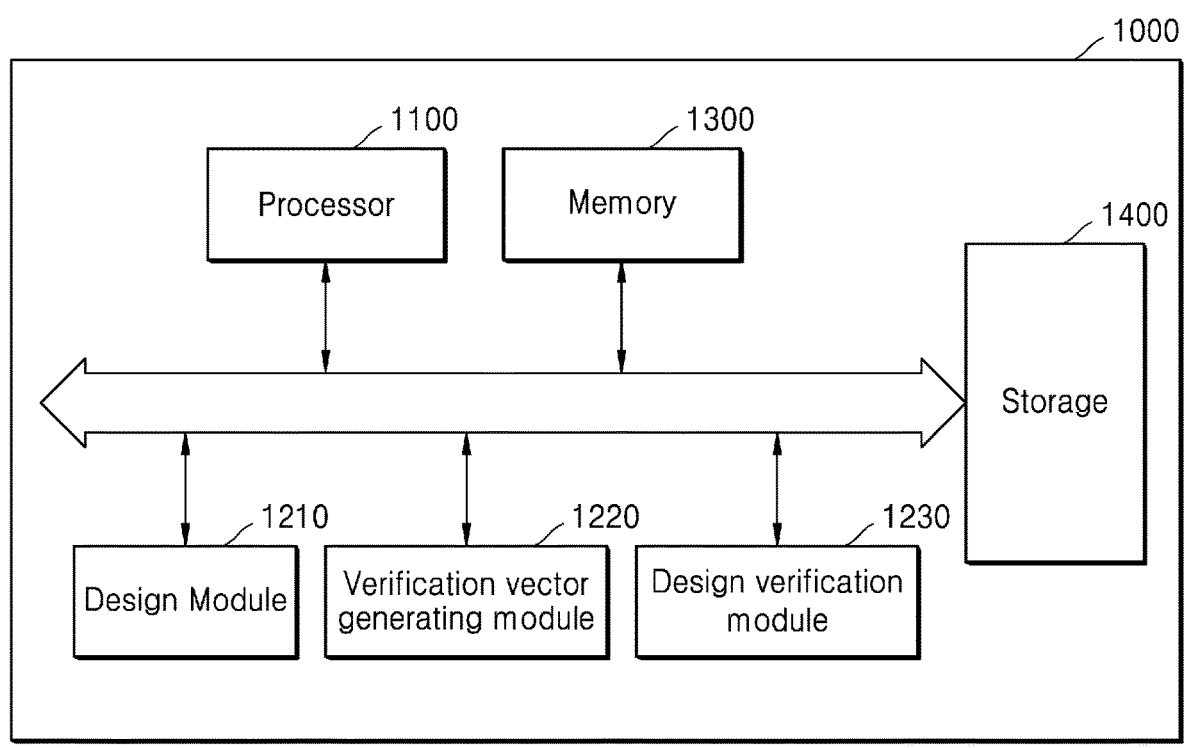
FIG. 12 is a block diagram illustrating a circuit design system according to an example embodiment of the inventive concept.

FIG. 12 is a block diagram illustrating a circuit design system 1000 according to an example embodiment of the inventive concept.

Referring to FIG. 12, the circuit design system 1000 may include a processor 1100, a design module 1210, a verification vector generating module 1220, a design verification module 1230, a memory 1300, and a storage 1400. The design verification module 1230 may be referred to as a design verifier. In FIG. 12, only one processor 1100 is illustrated. However, more processors may be provided. The design module 1210 may generate a circuit design by using the processor 1100. The verification vector generating module 1220 may train the estimation model according to the above-described embodiments by using the processor 1100. The design verification module 1230 may verify a circuit design by inputting at least one verification vector determined by training the estimation model to the circuit design by using the processor 1100 and analyzing an output of the circuit design. The memory 1300 may store data required for generating the circuit design, determining the verification vector, and verifying the circuit design by the design module 1210, the verification vector generating module 1220, and the design verification module 1230 using the processor 1100. The verified circuit design may be stored in the storage 1400.

The term 'module' means a hardware component such as a field programmable gate array (FPGA) or an application specific integrated circuit (ASIC) and the 'module' performs certain functions. However, the 'module' is not limited to software or hardware. The 'module' may be provided in a storage medium for performing addressing or may reproduce one or more processors. Therefore, for example, the 'module' may include components such as software components, object-oriented software components, class components, and task components, processes, functions, attributes, procedures, subroutines, segments of a program code, drivers, firmware, a microcode, a circuit, data, a database, data structures, tables, arrays, and variables. The components and a function provided in the 'modules' may be combined with the smaller number of components and 'modules' or may be divided into additional components and 'modules'.

While the inventive concept has been particularly shown and described with reference to embodiments thereof, it will be understood that various changes in form and details may be made therein without departing from the scope of the following claims.

What is claimed is:

1. An electronic device configured to generate a verification vector for verifying a semiconductor circuit including a first circuit block and a second circuit block, the electronic device comprising:
    a duplicate command eliminator configured to receive a first input vector including a plurality of commands and to provide a first converted vector, in which ones of the plurality of commands that generate the same state transition are changed into idle commands, based on a state transition of the first circuit block obtained by performing a simulation operation on the first input vector;
    a reduced vector generator configured to provide a first reduced vector in which a number of repetitions of the idle commands included in the first converted vector is reduced; and
    a verification vector generator configured to output the first reduced vector selected based on a coverage and a number of the idle commands among a plurality of first reduced vectors, as a first verification vector,
    wherein the verification vector generator is configured to train an estimation model for estimating the first verification vector based on the number of the idle commands included in the first reduced vector and the coverage of the first reduced vector and output the first verification vector based on the trained estimation model.

2. The electronic device of claim 1, wherein the verification vector generator is configured to generate a first function value in accordance with a first function when the coverage of the first reduced vector coincides with a target coverage, generate a second function value in accordance with a second function when the coverage of the first reduced vector is less than the target coverage, and train the estimation model having the first function value and the second function value.

3. The electronic device of claim 2, wherein the verification vector generator is configured to output the first reduced vector, in which the first function value with a smallest number of the idle commands is drawn from first function values generated by the estimation model by performing Bayesian optimization, as the first verification vector.

4. The electronic device of claim 2,
    wherein the first function value is reduced as the number of the idle commands decreases, and
    wherein the second function has a constant value greater than the first function value regardless of the number of the idle commands.

5. The electronic device of claim 2,
    wherein the verification vector generator is configured to obtain the coverage of the first reduced vector by simulating the first reduced vector on the first circuit block,
    wherein the coverage of the first reduced vector is a value obtained by dividing a number of state transitions that may be generated when the first reduced vector is input to the first circuit block by a total number of state transitions that may be generated by the first circuit block, and
    wherein a value of the target coverage is 1.

6. The electronic device of claim 1, wherein the reduced vector generator is configured to determine a number of most likely idle commands in the first reduced vector as a first value based on the trained estimation model and reduce the number of repetitions of the idle commands based on the first value.

7. The electronic device of claim 1, wherein the verification vector generator is configured to receive a plurality of first reduced vectors a predetermined number of times and train the estimation model the predetermined number of times based on the plurality of first reduced vectors.

8. The electronic device of claim 1, wherein the duplicate command eliminator is configured to change commands corresponding to state transitions other than an earliest generated state transition among a plurality of same state transitions into the idle commands.

9. The electronic device of claim 8, wherein the plurality of same state transitions are recorded in a simulation log obtained by simulating the first input vector on the first circuit block.

10. The electronic device of claim 9, wherein the simulation log records at least one of the plurality of commands included in the first input vector, a time at which the commands included in the first input vector are simulated on the first circuit block, a state transition of the first circuit block generated in response to the commands included in the first input vector, and a time at which the state transition is generated.

11. The electronic device of claim 1, wherein the reduced vector generator is configured to distinguish repeated idle commands based on the number of repetitions of the idle commands and a time at which the idle commands are generated.

12. The electronic device of claim 1, further comprising a design verifier configured to verify a design of the first circuit block by using the first verification vector, and wherein the coverage of the first reduced vector is based on simulation of the first reduced vector.

13. The electronic device of claim 1, wherein the first input vector is included in a first input vector set for verifying the first circuit block and the first circuit block performs a function different from that of the second circuit block.

14. An electronic device configured to generate a verification vector for verifying a semiconductor circuit including a first circuit block and a second circuit block, the electronic device comprising:

a duplicate command eliminator configured to receive a first input vector including a plurality of commands and to provide a first converted vector, in which at least some of the plurality of commands included in the first input vector are changed into idle commands;

a reduced vector generator configured to provide a first reduced vector in which a number of repetitions of the idle commands included in the first converted vector is reduced; and a verification vector generator configured to train an estimation model for estimating a first verification vector based on a number of the idle commands included in the first reduced vector and a coverage of the first reduced vector and to output the first reduced vector selected among a plurality of first reduced vectors based on the trained estimation model.

15. The electronic device of claim 14, wherein the verification vector generator is configured to generate a first function value in accordance with a first function when the coverage of the first reduced vector coincides with a target coverage, generate a second function value in accordance with a second function when the coverage of the first reduced vector is less than the target coverage, and train the estimation model having the first function value and the second function value.

16. The electronic device of claim 14, wherein the duplicate command eliminator is configured to provide the first converted vector based on a state transition of the first circuit block obtained by performing a simulation operation on the first input vector, and wherein the coverage of the first reduced vector is based on simulation of the first reduced vector.

17. A method of operating an electronic device that generates a verification vector for verifying a semiconductor circuit including a first circuit block and a second circuit block, the method comprising:

receiving a first input vector including a plurality of commands;

providing a first converted vector in which at least some of the plurality of commands included in the first input vector are changed into idle commands;

providing a first reduced vector in which a number of repetitions of the idle commands included in the first converted vector is reduced; and selecting the first reduced vector based on a coverage that coincides with a target coverage and a number of the idle commands that is smallest among a plurality of first reduced vectors, as a first verification vector and outputting the first verification vector, wherein the selecting of the first reduced vector as the first verification vector and the outputting of the first verification vector comprises:

training an estimation model for estimating the first verification vector based on the number of the idle commands included in the first reduced vector and the coverage of the first reduced vector; and selecting the first reduced vector having the coverage that coincides with the target coverage, and further having the number of the idle commands that is smallest, based on the trained estimation model.

18. The method of claim 17, wherein the providing of the first converted vector in which at least some of the plurality of commands included in the first input vector are changed into the idle commands further comprises changing ones of the plurality of commands that generate the same state transition into the idle commands based on a state transition of the first circuit block obtained by performing a simulation operation on the first input vector.

19. The method of claim 17, wherein the selecting of the first reduced vector having the coverage that coincides with the target coverage, and further having the number of idle commands that is smallest, based on the trained estimation model further comprises determining a number of most likely idle commands in the first reduced vector as a first value based on the trained estimation model and reducing the number of repetitions of the idle commands based on the first value.

20. The method of claim 17, wherein the at least some of the plurality of commands comprise commands that cause the same state transition of the first circuit block, and wherein the coverage of the first reduced vector is based on simulation of the first reduced vector.

* * * * *